United States Patent [19]

Clark

[11] Patent Number: 5,644,263

[45] Date of Patent: Jul. 1, 1997

[54] GROUND LOOP ELIMINATION

[76] Inventor: George E. Clark, 1900 Alta West Rd., Mansfield, Ohio 44903

[21] Appl. No.: 459,256

[22] Filed: Jun. 2, 1995

Related U.S. Application Data

[60] Division of Ser. No. 945,092, Sep. 15, 1992, Pat. No. 5,422,804, and a continuation-in-part of Ser. No. 945,092.

[51] Int. Cl.$^6$ .............................. H03K 5/08; H03K 17/16
[52] U.S. Cl. .......................... 327/310; 327/317; 327/314; 327/378; 327/384; 327/379
[58] Field of Search ...................................... 327/306, 309, 327/310, 314, 317, 320, 325, 378, 379, 382, 384, 565; 326/21, 30

[56] References Cited

U.S. PATENT DOCUMENTS

| | | | |
|---|---|---|---|
| 2,841,719 | 7/1958 | Radcliffe, Jr. | 327/314 |
| 3,573,774 | 4/1971 | Olsen | 327/314 |
| 3,703,678 | 11/1972 | Weller | 323/19 |
| 4,791,321 | 12/1988 | Tanaka et al. | 326/30 |
| 5,394,021 | 2/1995 | Karpinski | 327/108 |
| 5,422,804 | 6/1995 | Clark | 363/44 |

*Primary Examiner*—Toan Tran
*Attorney, Agent, or Firm*—Jerry Semer

[57] ABSTRACT

The inventor has created several methods to eliminate or greatly reduce the ground loop problem. The inventor has discover that ground loop distortion is caused by the switching from positive to negative in alternating current. He has designed several devices to eliminate this problem. In his first embodiment he places a set of two diodes either cathode to cathode or anode to anode, or a neon bulb, or piezoelectric crystals in parallel with all the capacitors in an amplifier or other electronic device. These sets of diodes eliminate the ground loop distortion within the amplifier or electronic device. The applicant has also devises several power supply that eliminate or greatly reduce the ground loop distortion in an amplifier or electronic device they are attached to. Also the applicant has found that by attaching two diodes either anode to anode or cathode to cathode, or a neon bulb, or a piezoelectric crystals between an audio, video or digital cable and its ground will reduce distortion within the cable.

4 Claims, 17 Drawing Sheets

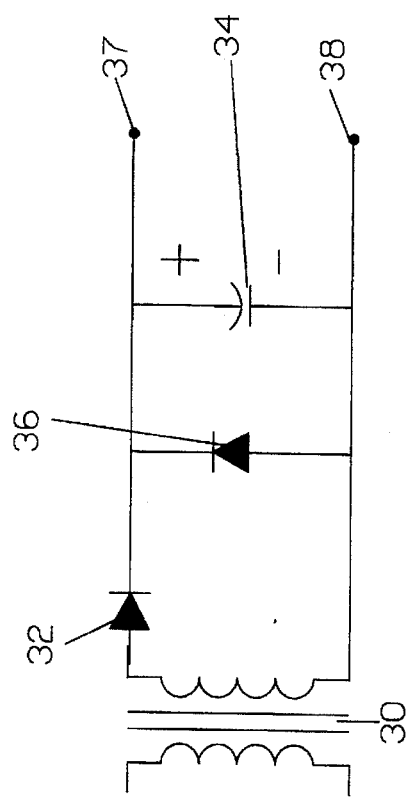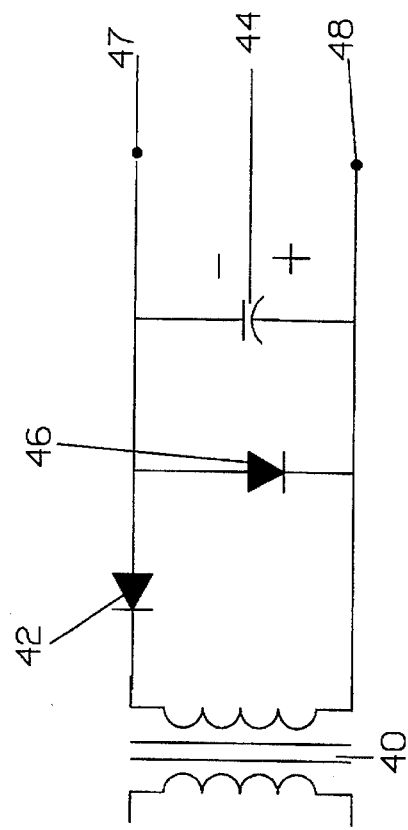

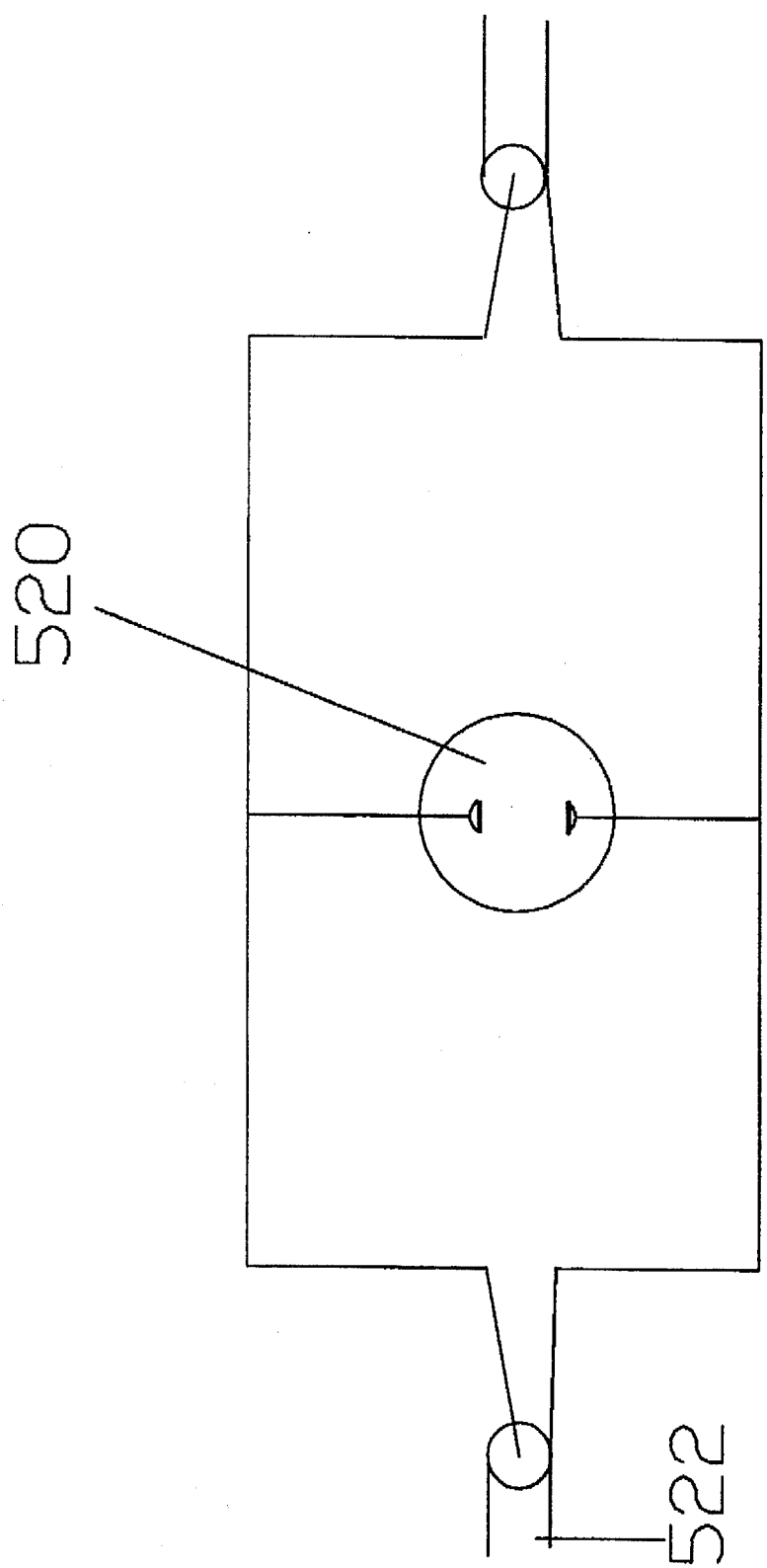

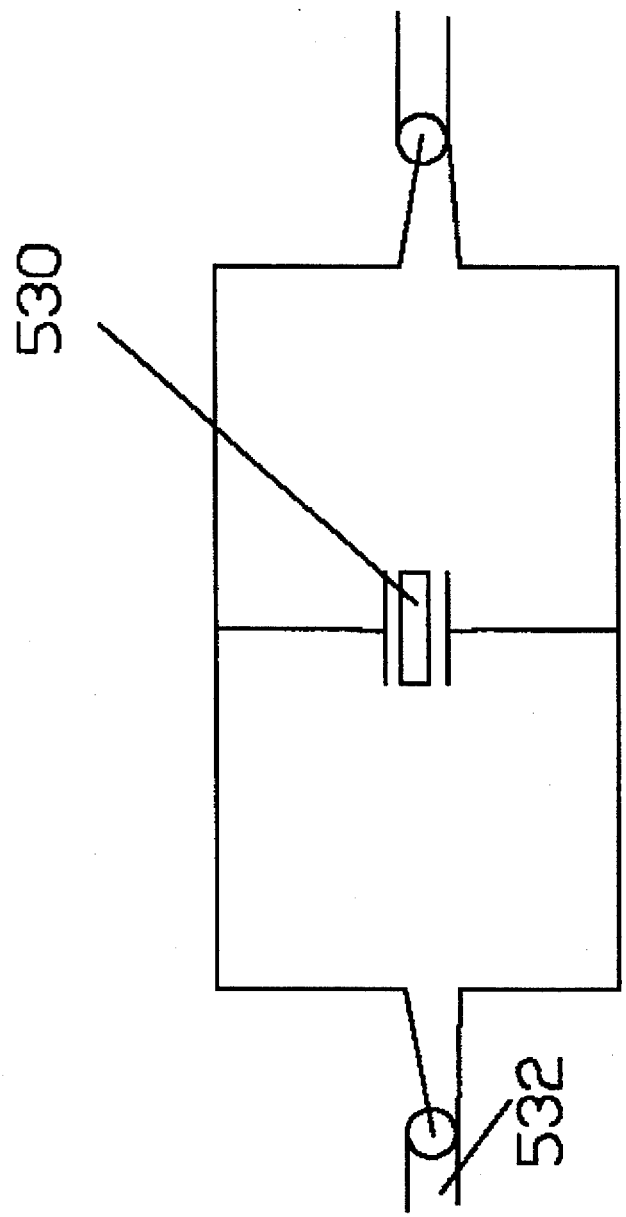

GROUND LOOP ELIMINATION

This application is a division and continuation-in-part of application Ser. No. 07/945,092, filed Sep. 15, 1992, now U.S. Pat. No. 5,422,804.

FIELD OF INVENTION

The present invention relates to a device that eliminates crossover distortion and more particularly to a device that solves the ground loop problem.

BACKGROUND OF THE INVENTION

All devices which need current for operation have, up until the time of this invention, an unsolved ground loop problem. It usually consists of varying ghost images or cross over distortion. The usual method of ridding the system of distortion is by filtering the end product. This is like closing the barn door after the cattle have escaped. The inventor's remedy stops the problem distortion at the source by eliminating the ground loop problem with his invention. Thus, the object of this invention is to eliminate the ground loop problem. Further, the object of this invention is to greatly reduce the distortion of any electronic device by eliminating the ground loop problem. The invention that achieved this elimination of the ground loop problem is a unique circuit that consists of diodes, piezoelectric crystals, neon bulbs, or transient surge suppressor. The advantage of the inventor's system is that distortion, the power consumption, and the unwanted heating of the device to which the invention is connected, is greatly reduced.

SUMMARY OF INVENTION

The inventor has created several methods to eliminate or greatly reduce the ground loop problem. The inventor has discover that ground loop distortion is caused by the switching from positive to negative in alternating current. He has designed several devices to eliminate this problem. In his first embodiment, he places a set of two diodes, either cathode to cathode or anode to anode in parallel with all the capacitors and coils in an amplifier or other electronic device. These sets of diodes eliminate the ground loop distortion within the amplifier or electronic device. One can also use neon bulbs or piezoelectric crystals in parallel with all the capacitors in an amplifier or electronic device to reduce the ground loop distortion. The applicant has also devised several power supplies that eliminate or greatly reduce the ground loop distortion in an amplifier or electronic device they are attached. Also, the applicant has found that by attaching two diodes either anode to anode or cathode to cathode, between an audio, video or digital cable and its ground will reduce distortion within the cable. One can also use piezoelectric crystals or neon bulbs in place of the diodes to reduce the distortion in the circuit. The applicant has found that his invention not only reduces and eliminates the ground loop distortion in audio and video circuits and cables but also allows digital circuits to work at a much higher speed due to the elimination of this distortion.

DESCRIPTION OF THE DRAWINGS

FIG. 5 is a schematic drawing of a power supply of the invention.

FIG. 6 is a schematic drawing of a power supply of the invention.

FIG. 21 is a schematic with neon bulbs attached between a cable and the cable's ground.

FIG. 22 is a schematic drawing of a cable with piezoelectric crystals attached between a cable and the cable's ground.

DETAILED DESCRIPTION OF THE PREFERRED EMBODIMENT

Figure 1:
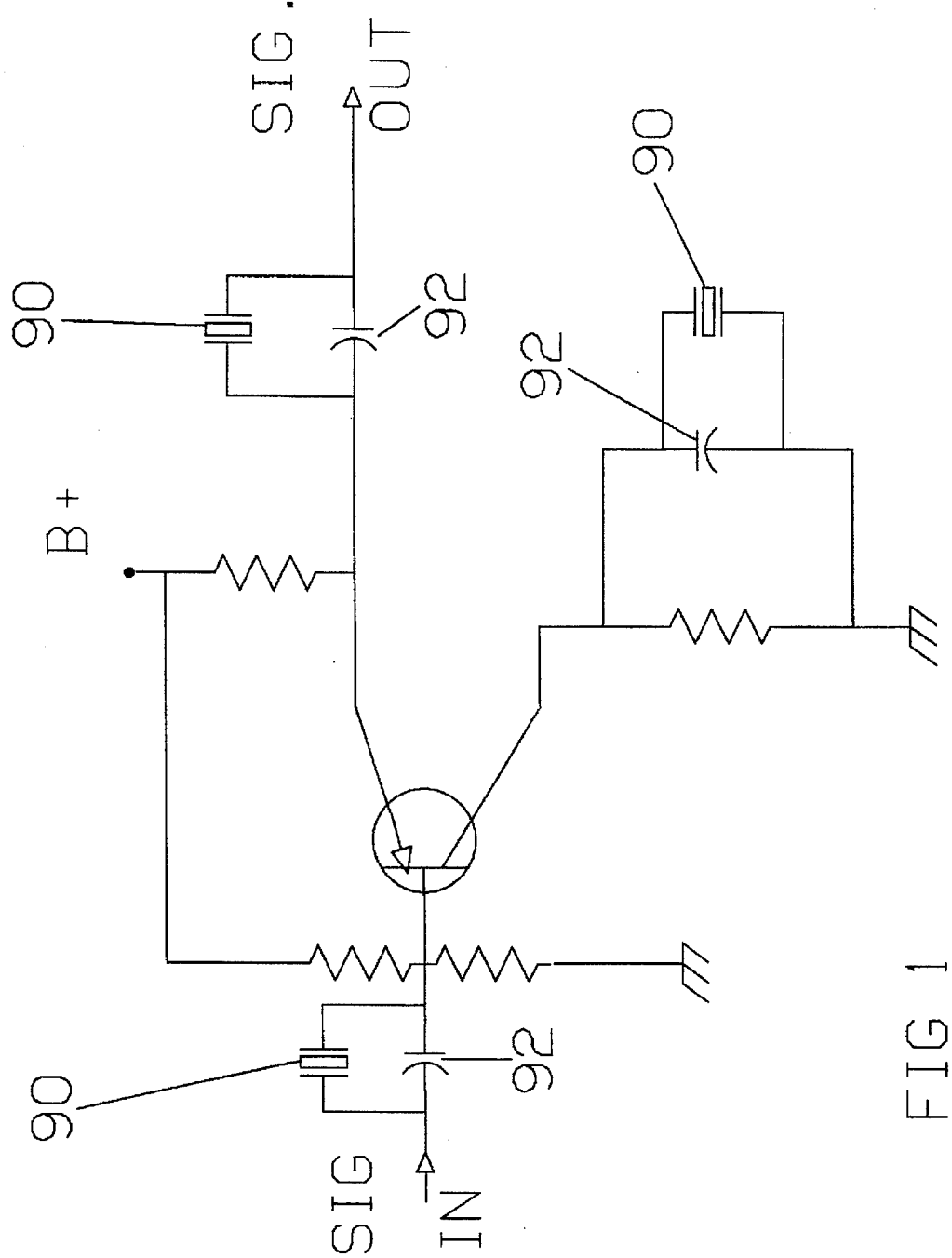
FIG. 1 is a schematic drawing of an amplifier with piezoelectric crystals in parallel with all the capacitors.
Figure 2:
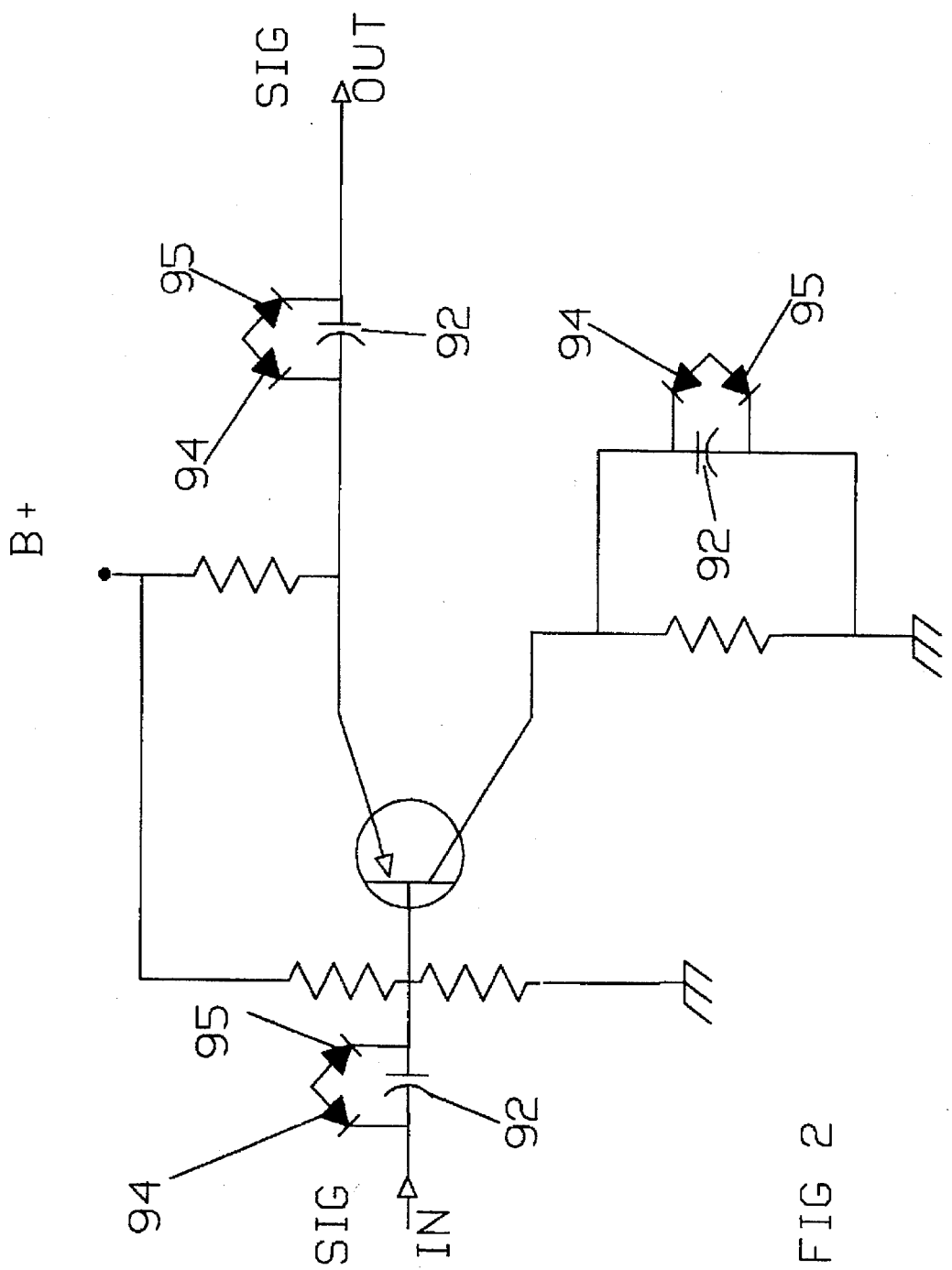
FIG. 2 is a schematic drawing of an amplifier with diodes and parallel with all the capacitors.
Figure 3:
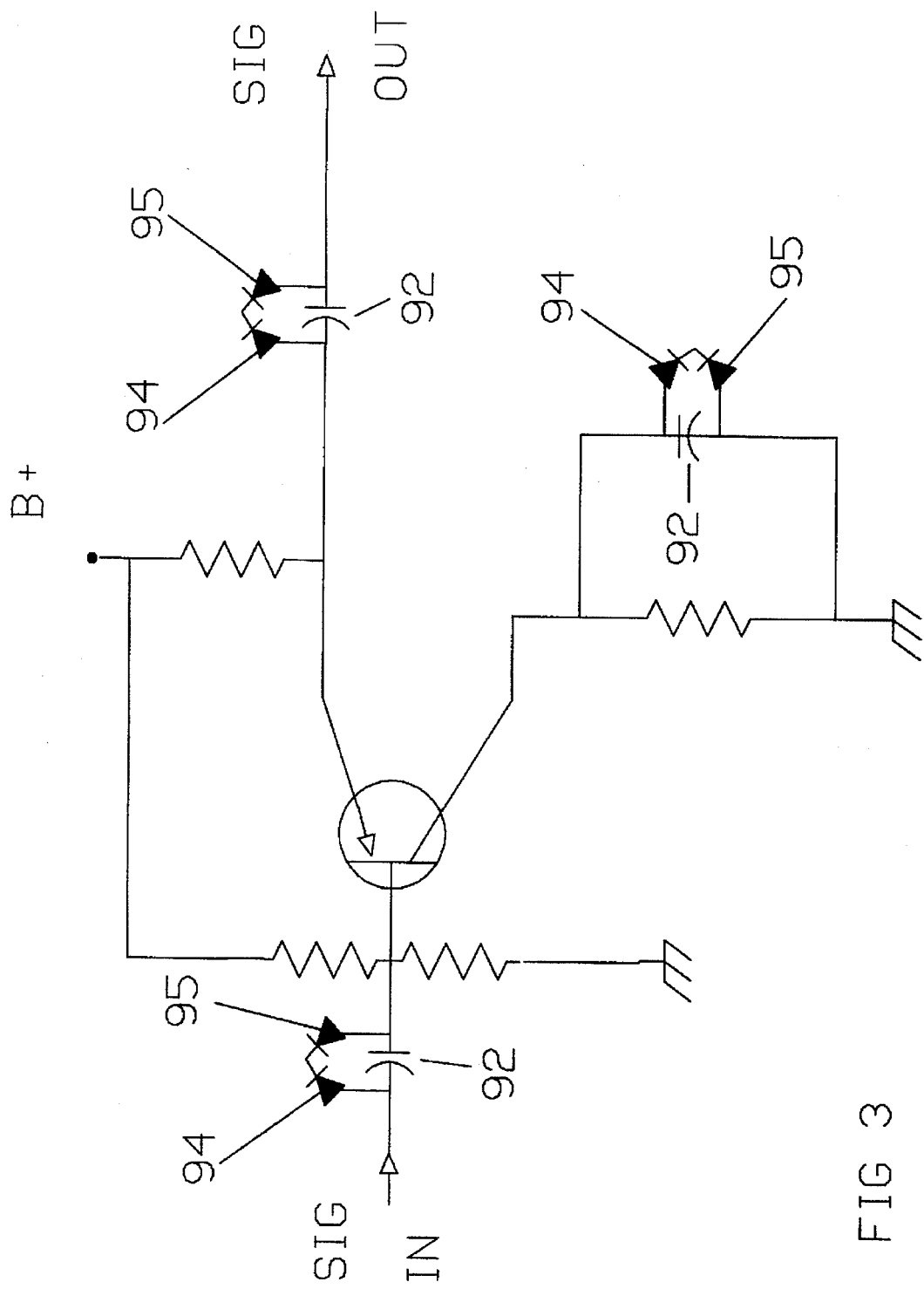
FIG. 3 is a schematic drawing of another embodiment of an amplifier with diodes in parallel with all the capacitor.
Figure 4:
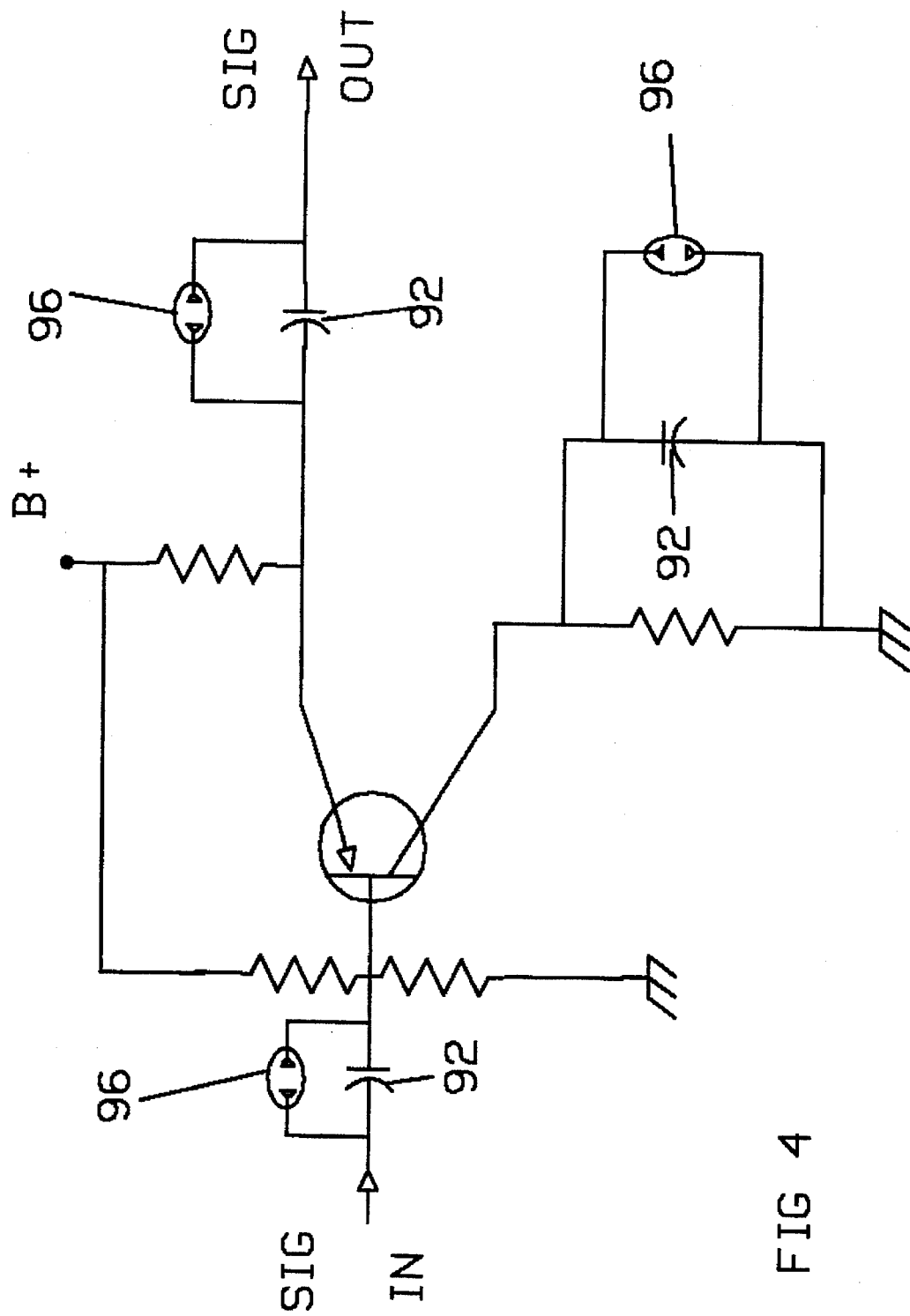
FIG. 4 shows a schematic drawing of an amplifier with neon bulbs in parallel with all the capacitors.

Reference is now made to the figures. In the figures all like parts are represented by like reference numerals. FIG. 1 shows one of the inventor's embodiment for elimination of the ground loop problem. In this embodiment piezoelectric crystals 90 are attached in parallel with each of the capacitors 92 in the simple transistor amplifier. However, the principle of attaching piezoelectric crystals in parallel with capacitors can be used in any amplifier or electronic device. In these devices, the piezoelectric crystals attached in parallel to capacitors will help eliminate the ground loop problem. FIG. 2 and 3 show that the piezoelectric crystals can be replaced with a diodes 94 and 95 attach anode to anode as in FIG. 2 or cathode to cathode as in FIG. 3. The applicant has found that these diodes 94 and 95 attach anode to anode and cathode to cathode when attached in parallel across all the capacitors in an amplifier or electronic device is the best method for elimination of the ground loop problem. The applicant has found that piezoelectric crystals with a resonate frequency of 400 kilohertz or less, which are attached to all the capacitors in the electronic device or amplifier works almost as well as the diodes attached in parallel across all the capacitors. As shown in FIG. 4 neon bulbs 96 can also be used. These neon bulbs 96 are as the diodes 94 and 95 and the piezoelectric crystals 90, attached in parallel across the capacitor in an amplifier or electronic device. The neon bulbs work better then the piezoelectric crystals in eliminating ground loop distortion, but not nearly as well as the diodes.

Another way to cut the ground loop distortion is to modify the power supply. FIG. 5 and FIG. 6 shows the ways of modifying a half wave rectifier power supply. Basically with this design a diode is placed across the output lines beyond the regular half wave rectifier diode. In FIG. 5 diode 32 is the diode of the regular half wave of the rectifier. Diode 36 is then put across the output lines, with its cathode hooked to the positive output 37 and its anode hooked to the negative output 38 in the circuit. Diode 36 is hooked across the output lines with it's cathode end hooked to the cathode diode 32. An electrolytic capacitor is hooked to the two outputs, 37 and 38 of the power supply. In FIG. 6, diode 42, which is he diode of a regular half wave rectifier is placed in the circuit allowing electric to flow in the opposite direction as diode 32. In this case, diode 46 is placed in the circuit to eliminate the ground loop problem and is placed across the output lines 47 and 48 with its anodes attached to the anode of diode 42. The cathode of diode 46 is attached to the positive output 48 and the anode is attached to the negative output 47. Capacitor 44 is attached across the two outputs 47 and 48. By attaching this extra diode, these power supplies will eliminate the ground loop problem in the electronic device.

Figure 7:
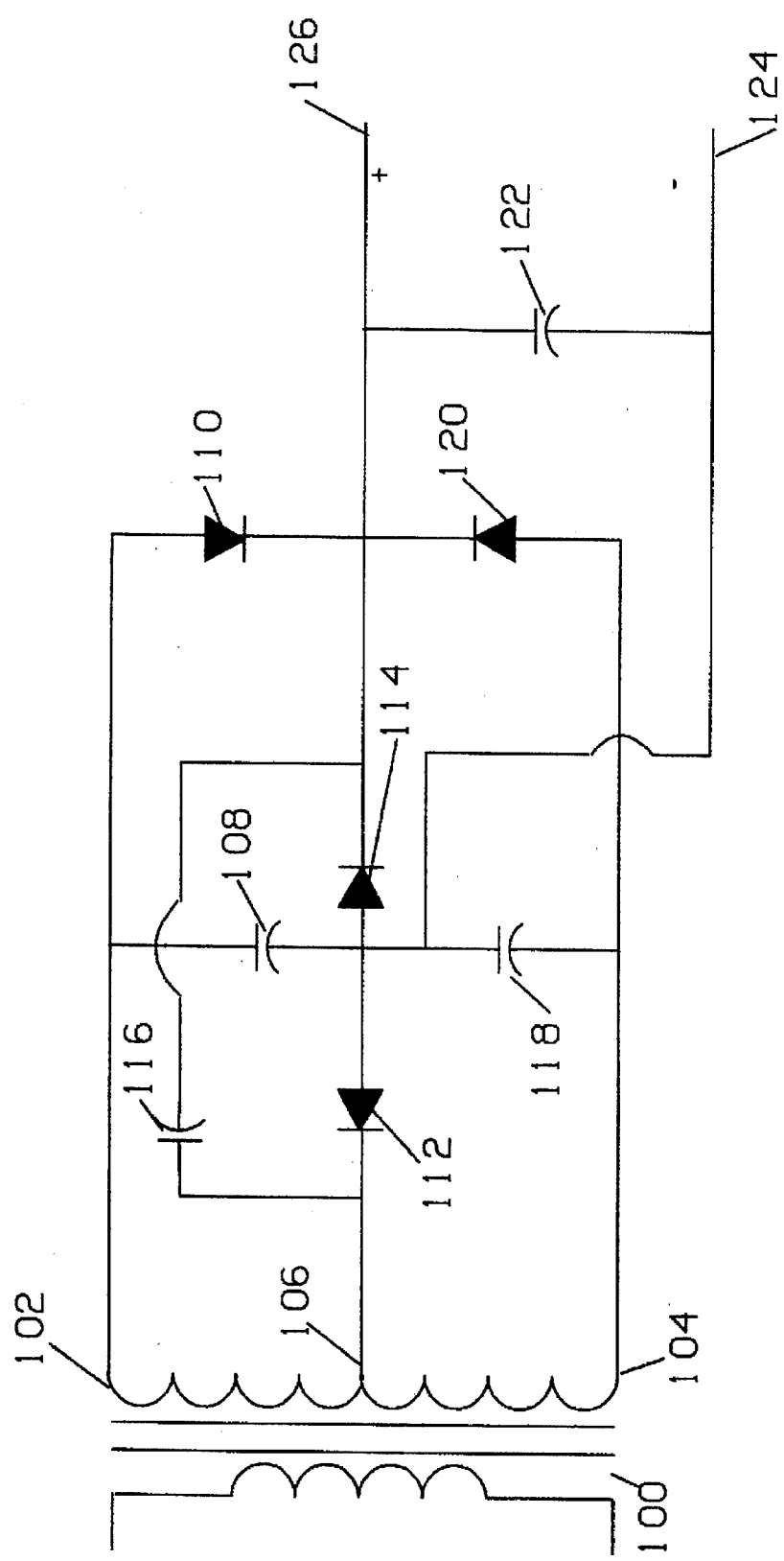
FIG. 7 is a schematic drawing of a power supply of the invention.
Figure 8:
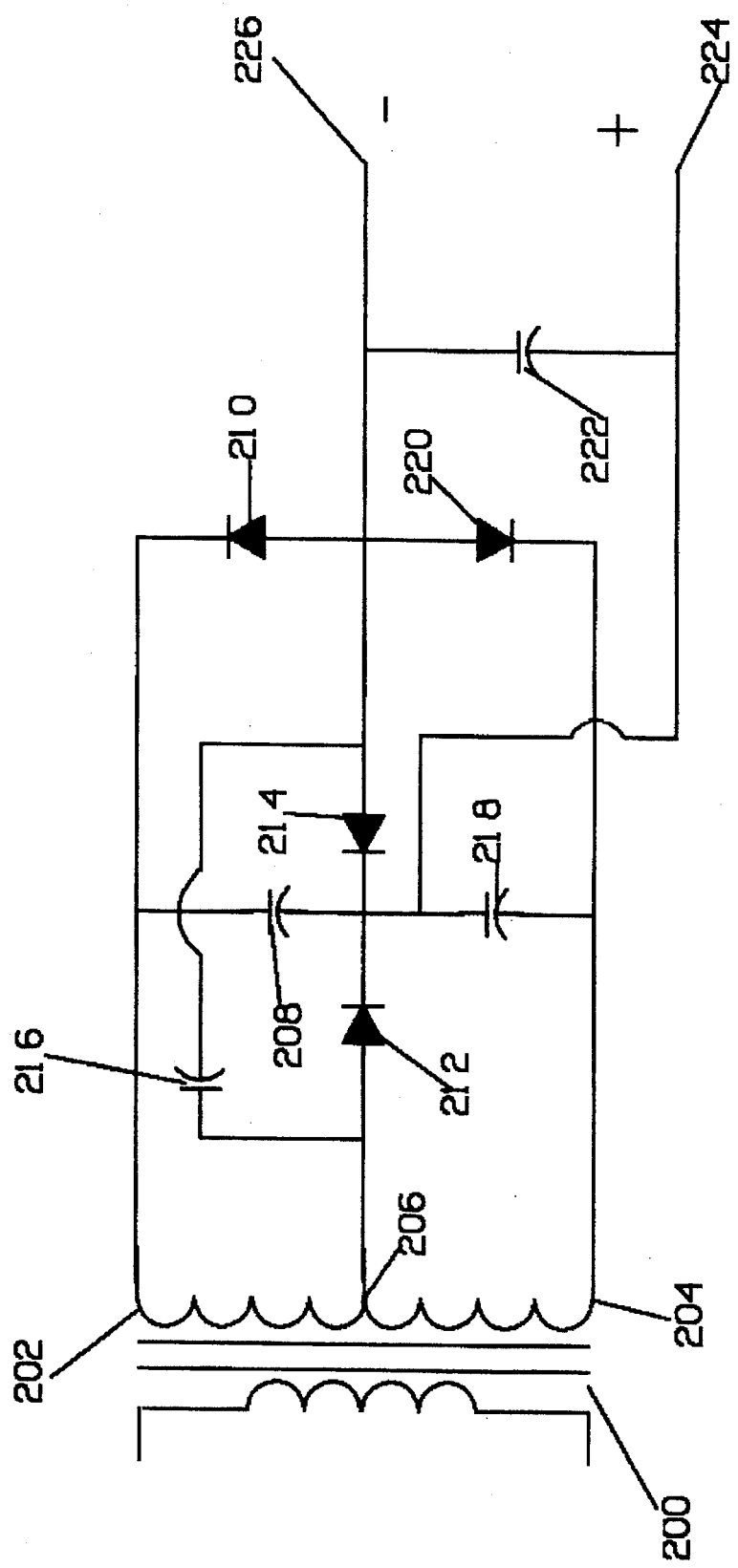
FIG. 8 is a schematic drawing of a power supply of the invention.

FIG. 7 and 8 show designs of power supply that eliminate the ground loop problem when attached to a electronic device. In FIG. 7 the power supply has a center transformer 100 with outputs 102 and 104 and a center tap 106. Diode 112 cathode is attached to the center tap 106. Diode 112 anode is attached to one of the terminal ends of capacitor 108 and the other end of capacitor 108 is attached to the output of the transformer 102. Diode 112 anode is also attached to diode 114 anode. Capacitor 116 is attached to the cathode of diode 112 and center tap 106 at one terminal end and the cathode of diode 114 at the other terminal end. Diode 110 anode is attached to output 102 of the transformer and capacitor 108. The cathode of diode 110 is attached to the cathode of diode 120 and diode 114 and capacitor 116. The negative output of the power supply 124 is attached to the anode of diodes 112 and 114 and a terminal end of capacitor 108 and capacitor 118. Capacitor 118 other terminal end is attached to output 104 of the transformer. Diode 120 cathode is attached to the cathode of diode 110 and the cathode of diode 114 and capacitor 116. Diode 120 anode is attached to output 104 of the transformer and a terminal end of capacitor 118. A positive output of the power supply is attached to the cathode of diodes 110, 114 and 120 as well as capacitor 116. A electrolytic capacitor 122 is attached across the positive output of the power supply 126 and the negative output of the power supply 124. Capacitor 122 positive terminal end is attached to the positive output of the power supply 126 and capacitor 122 negative terminal end is attached to the negative output of the power supply 124.

Another embodiment of a power supply that when attached to a electronic device will eliminate the ground loop problem is shown in FIG. 8. In this figure the diodes are attached to allow the flow of electric in the opposite directing of the diode in FIG. 7. The power supply in FIG. 8 shows a center tap transformer 200 with outputs 202 and 204 and a center tap 206. Attached to center tap 206 is the anode of diode 212. Attached to the cathode of diode 212 is cathode of diode 214 and capacitors 208 and 218. Capacitor 208 other terminal end is attached to the output 202 of the transformer. The other terminal end of capacitor 218 is attached to output 204 of the transformer. Also attached to the cathode of diode 212 is the positive output of this power supply 224. One of the terminal ends of capacitor 216 is attached to the center tap 206 and the anode of diode 212. The other terminal end of capacitor 216 is attached to the anode of diode 214. Also attached to the anode of 214 and capacitor 216 are the anode of diodes 210 and 220. The cathode of diode 210 is attached to capacitor 208 and output 202 of the transformer. The cathode of diode 220 is attached to capacitor 218 and output 204 of the transformer. A negative output of the power supply is attached to the anodes of diodes 210, 220 and 214 and capacitor 216. An electrolytic capacitor 222 is attached across the output of the power supply 226 and 224. The negative terminal end of electrolytic capacitor 222 is attached to the negative output 226 of the power supply and the positive terminal end of capacitor 222 is attached to output 224 the positive output of the power supply.

Figure 9:
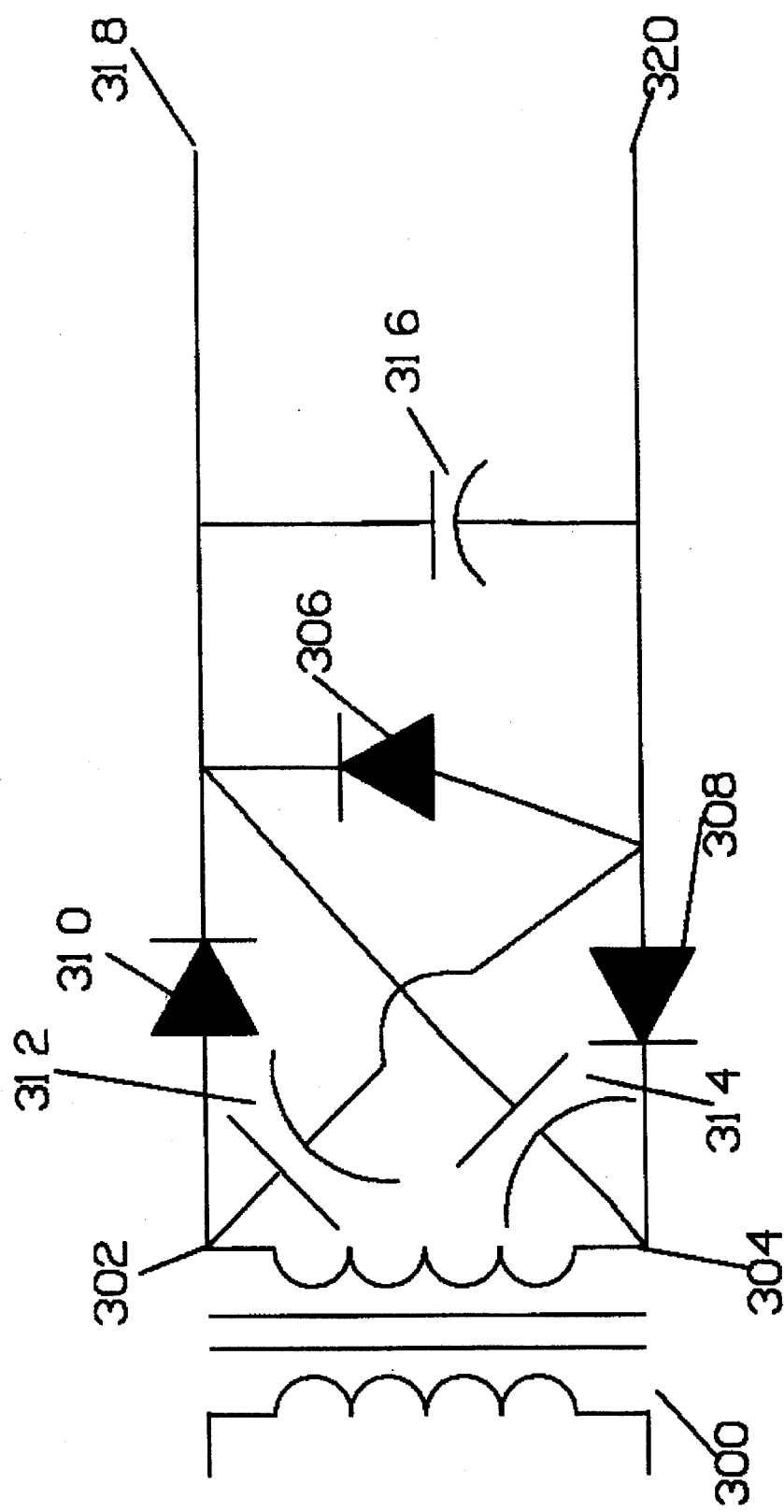
FIG. 9 is a schematic drawing of a power supply of the invention.

Another power supply that reduces the ground loop distortion when attached to an electronic device is shown in FIG. 9. This power supply is for a transformer without a center tap. Transformer 300 has outputs 302 and 304. Output 302 of the transformer is attached to bipolar capacitor 312 and diode 310. Output of transformer 304 is attached to bipolar capacitor 314 and diode 308. Capacitor 312 as stated before is attached at one terminal end to output of the transformer 302 and diode 310. Its other terminal end is attached to diode 308. Bipolar capacitor 314 is attached at one terminal end to output of the transformer 304 and diode 308 and at the other end is attached to diode 310. Diode 308 at one terminal end is attached to bipolar capacitor 314 and output of the transformer 304 and at diode 308 the other terminal end is attached to bipolar capacitor 312. Diode 310 is attached at one terminal end to the output of the transformer 302 and to bipolar capacitor 312 and at the other end is attached to bipolar capacitor 314. Diode 306 at one terminal end is attached to bipolar capacitor 314 and diode 310 and at the other terminal end is attached to bipolar capacitor 312 and diode 308. One of the output of the power supply 318 is attached to diode 306, bipolar capacitor 314 and diode 310. The other output of the power supply 320 is attached to diode 306, bipolar capacitor 312 and diode 308. Across outputs 318 and 320 a capacitor 316 is attached.

Figure 19:
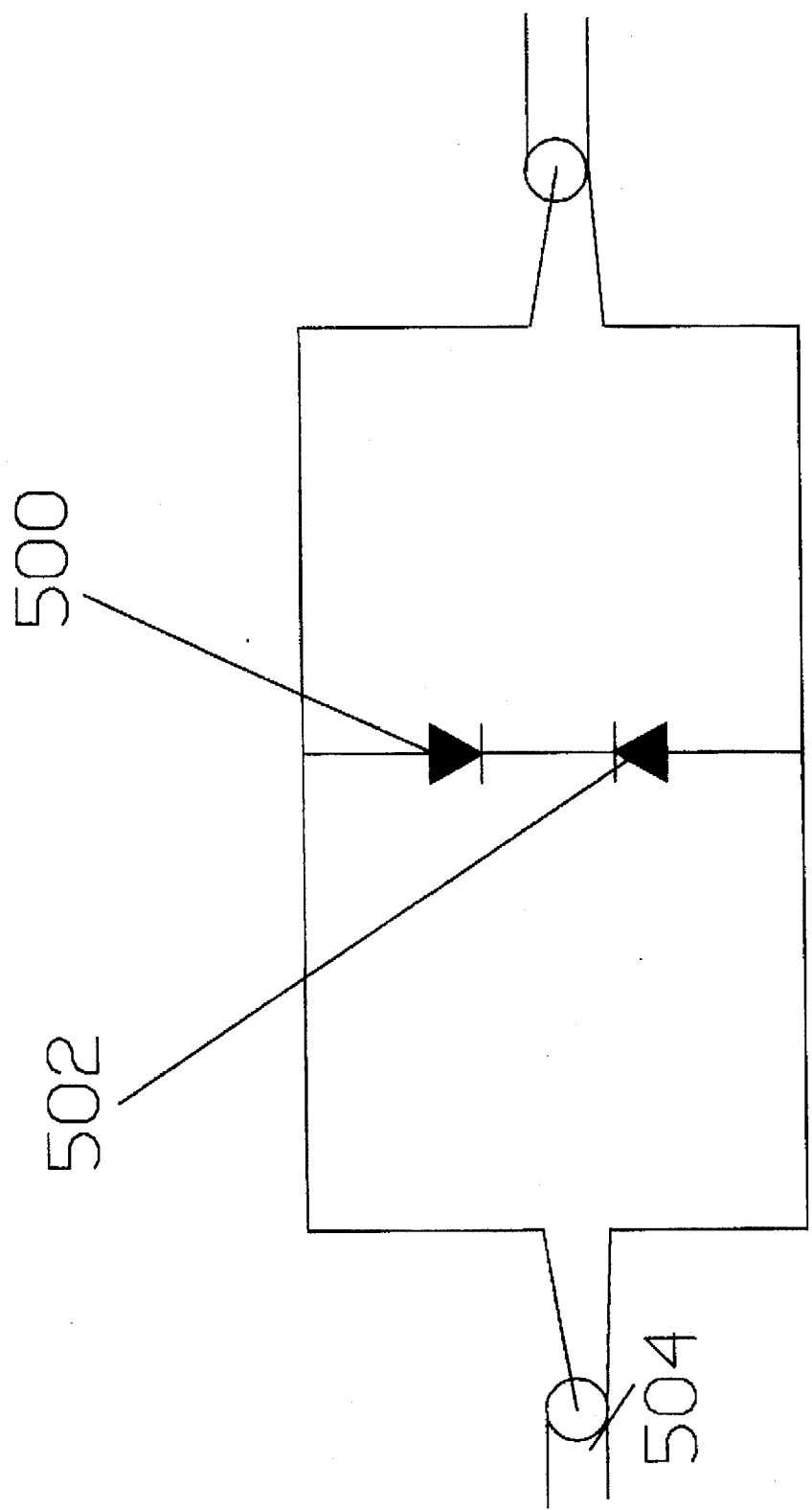
FIG. 19 is a schematic drawing of diodes attached between a cable and the cable's ground.
Figure 20:
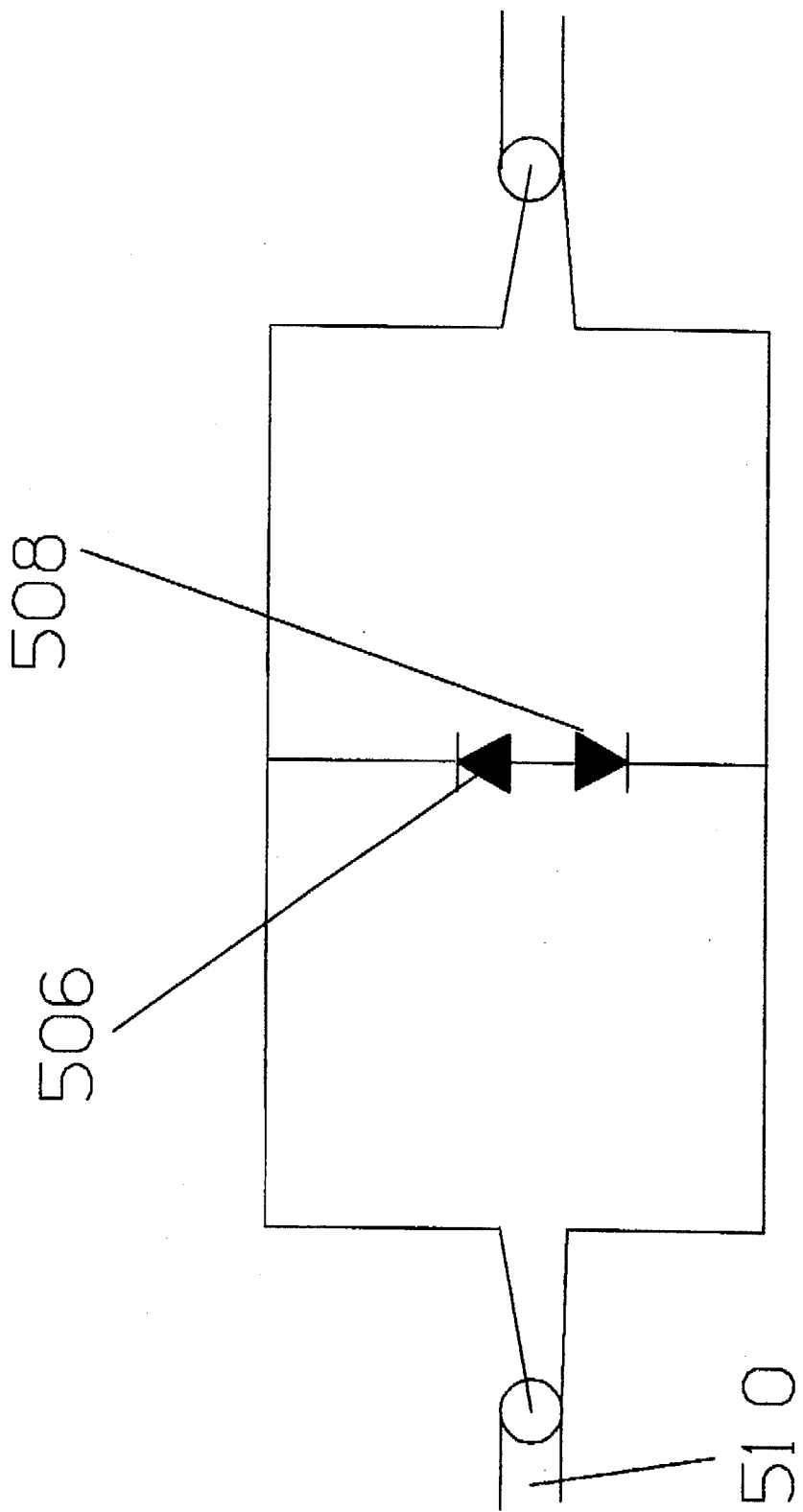
FIG. 20 is a schematic drawing of another embodiment of the invention with diodes attached between the cable and the cable's ground.

The applicant has also found that diodes, neon bulbs, and piezoelectric crystals can reduce distortion when attached in parallel to audio and video cables. FIG. 19, 20, 21, and 22 shows these embodiments of the invention. In FIG. 19 diodes 500 and 502 are attached cathode to cathode. These diodes are attached between cable 504 and its ground. In FIG. 20 diodes 506 and 508 are attached anode to anode, and are attached between the cable and its ground. By attaching the diodes between the cable and its ground, the applicant has solved the ground loop problem of the cable and has greatly reduced the distortion in the cable. The applicant further states that a neon bulb 520 as shown in FIG. 21 can be attached between the cable and its ground, and reduce the distortion of the cable. Neon bulbs work well but not as well as the diodes shown in FIGS. 19 and 20. Also a piezoelectric crystals 530 with a frequency of under 400 kilohertz can be attached between the cable and its ground as shown in FIG. 22. The piezoelectric crystal 530 will reduce distortion of the cable. However, it does not do as well as the diodes of 19 and 20 nor as well as the neon bulb in FIG. 21.

Figure 10:
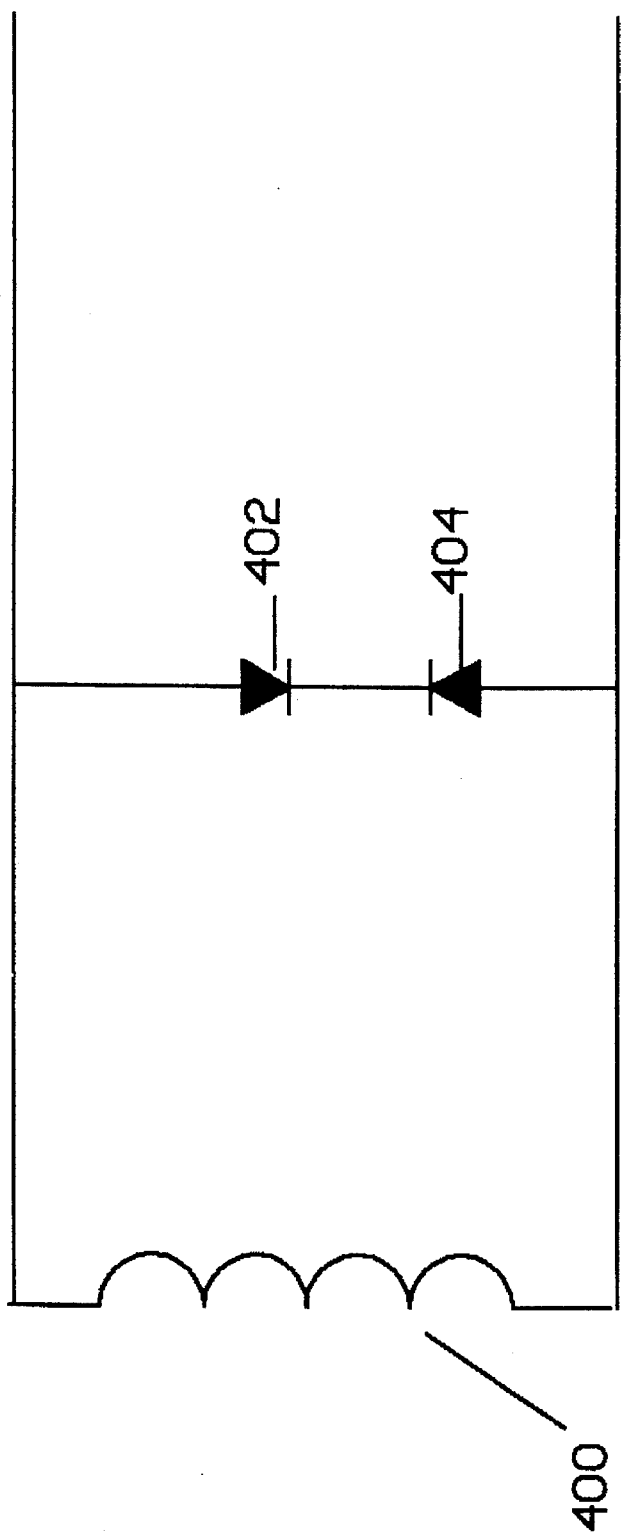
FIG. 10 is a schematic drawing with two diodes attached cathode to cathode across the outputs of an air core coil.
Figure 11:
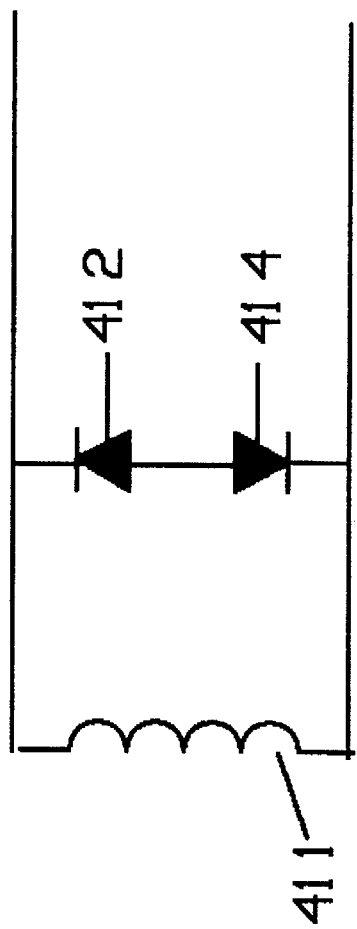
FIG. 11 is a schematic drawing of two diodes attached anode to anode across the output of an air core coil.
Figure 12:
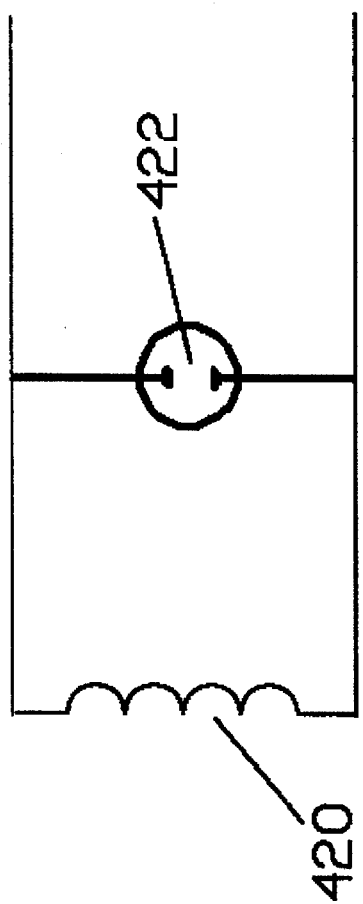
FIG. 12 is a schematic drawing of a neon light attached across the outputs of an air core coil.
Figure 15:
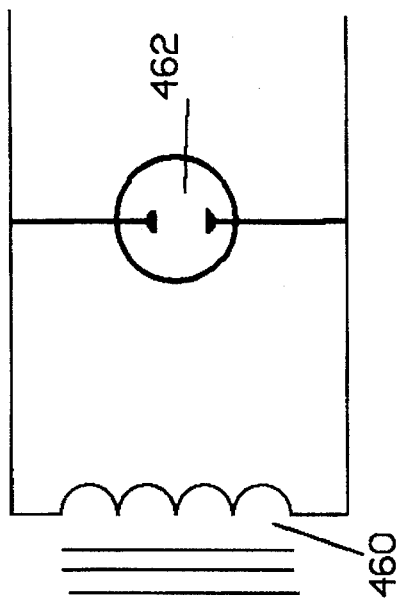
FIG. 15 is a schematic drawing of a neon bulb attached across the output of a coil with a core.
Figure 13:
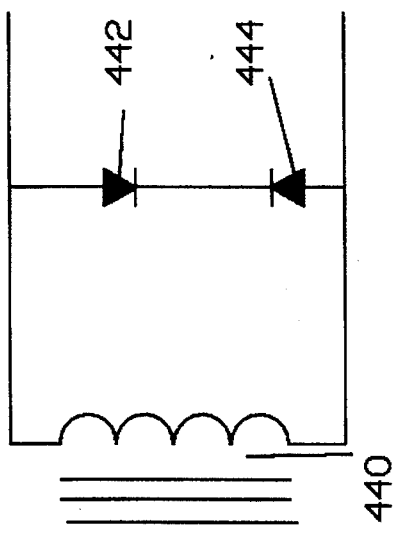
FIG. 13 is a schematic drawing with two diodes attached cathode to cathode across the outputs of a coil with a core.
Figure 14:
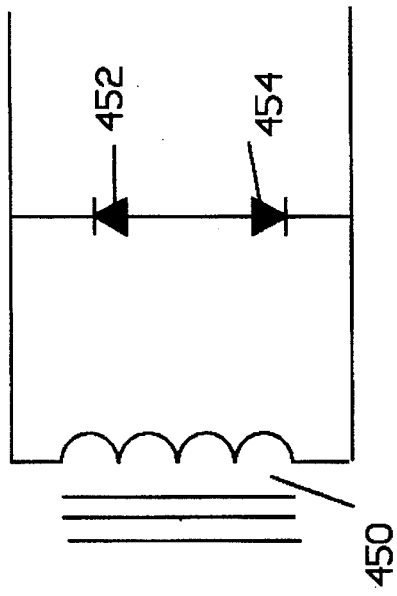
FIG. 14 is a schematic drawing of two diodes attached anode to anode across the outputs of a coil with a core.
Figure 18:
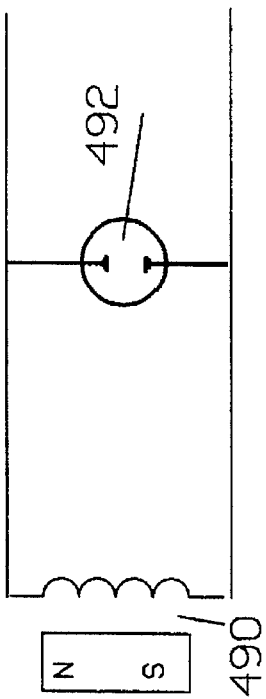
FIG. 18 is a schematic drawing of a neon bulb attached across the outputs of a coil with a magnetic core.
Figure 17:
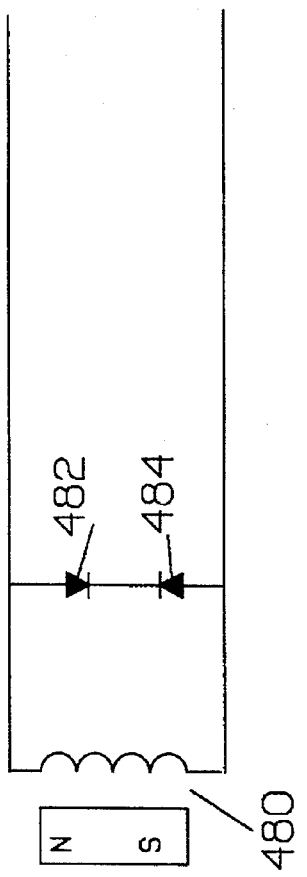
FIG. 17 is a schematic drawing of two diodes attached cathode to cathode across the outputs of a coil with a magnetic core.
Figure 16:
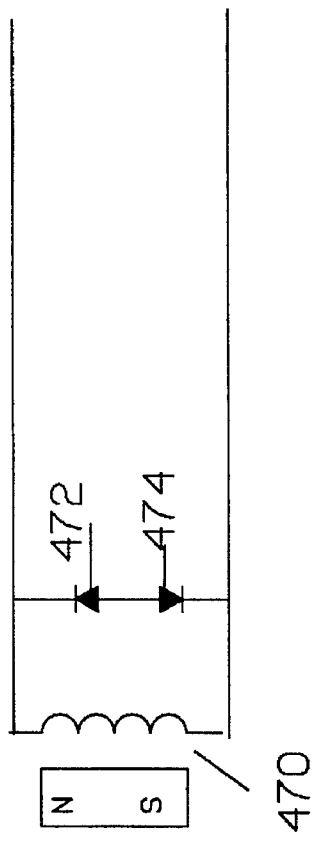
FIG. 16 is a schematic drawing of two diodes attached anode to anode across a coil with a magnetic core.

The applicant has also found that diodes, neon bulbs, piezoelectric crystals can reduce distortion when attached in parallel to coils within an electronic device. FIGS. 10, 11 and 12 shows diodes and neon bulbs attached to cross an air coil. FIG. 10 shows air core coil 400 with two diodes 404 and 402 attached cathode to cathode across the outputs of coil 400. FIGS. 11 shows an air core coil 410 with two diodes 412 and 414 attached anode to anode to the outputs of coil 410. FIGS. 12 shows air core coil 420 with a neon bulb 422 attached across the outputs of coil 420. FIG. 13 shows a coil with a core 440 with two diodes 442 and 444 attached cathode to cathode across the outputs of coil 440. FIG. 14 shows coil 450 with a core with two diodes 454 and 452 attached anode to anode the output of coil 450. FIG. 15 shows coil 460 with a core and a neon bulb 462 attached across the output of coil 460. FIG. 16 shows a coil with a magnetic core 470 with two diodes 472 and 474 attached anode to anode across the output of coil 470. FIG. 17 shows a coil with a magnetic core with two diodes 482 and 484 attached cathode to cathode across the output of coil 480. FIG. 18 shows coil 490 with a magnetic core and a neon bulb 492 attached across the output of coil 490.

Changes and modification in specifically described embodiment can be carried out without departing from the scope of the invention which is intended to be limited only by the scope by the appending claims.

I claim:

1. A method of reducing the ground loop and other distortion in an audio, video, or a digital cable with ground wires comprising:

a. placing an electronic device taken from the group consistence essentially of piezoelectric crystals, neon bulbs, or a set of two diode placed either anode to anode or a cathode to cathode between the cable and the ground wire.

2. A method for reducing ground loop and other distortion in an electronic devise comprising:

a. attaching an electrical component taken from the group consisting essentially of neon bulbs and two diodes attached either anode to anode or cathode to cathode between the output of all coils in said electronic device.

3. A method for reducing ground loop and other distortion of an electronic device comprising:

a. attaching an electronic device taken from the group consisting essentially of piezoelectric crystals, neon bulbs, or a set of two diodes placed either anode to anode or cathode to cathode in parallel with every capacitor in the electronic device.

4. A method for reducing distortion in an electronic device as in claim 3 further comprising:

a. attaching an electronic component taken from the group consisting essentially of neon bulbs, two diodes attached either anode to anode or cathode to cathode between the outputs of all coils in said electronic device.

\* \* \* \* \*